United States Patent
Abbott

(10) Patent No.: US 7,179,738 B2
(45) Date of Patent: Feb. 20, 2007

(54) SEMICONDUCTOR ASSEMBLY HAVING SUBSTRATE WITH ELECTROPLATED CONTACT PADS

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 10/985,757

(22) Filed: Nov. 9, 2004

(65) Prior Publication Data

US 2005/0280112 A1 Dec. 22, 2005

Related U.S. Application Data

(60) Provisional application No. 60/580,552, filed on Jun. 17, 2004.

(51) Int. Cl.
*H01L 21/445* (2006.01)
(52) U.S. Cl. .............. 438/654; 438/928; 438/667; 438/678
(58) Field of Classification Search ............ 438/654, 438/666, 667, 674, 678, 687, 686, 928
See application file for complete search history.

(56) References Cited

U.S. PATENT DOCUMENTS

| | | | | |
|---|---|---|---|---|
| 5,106,461 | A * | 4/1992 | Volfson et al. | 205/125 |
| 5,169,680 | A * | 12/1992 | Ting et al. | 438/629 |
| 5,707,893 | A * | 1/1998 | Bhatt et al. | 216/18 |
| 6,144,100 | A | 11/2000 | Shen et al. | |
| 6,426,011 | B1 * | 7/2002 | Katoh | 216/19 |
| 6,620,731 | B1 * | 9/2003 | Farnworth et al. | 438/667 |
| 6,683,380 | B2 | 1/2004 | Efland et al. | |
| 6,852,625 | B2 * | 2/2005 | Shin et al. | 438/678 |
| 6,872,590 | B2 * | 3/2005 | Lee et al. | 438/106 |
| 6,915,566 | B2 * | 7/2005 | Abbott et al. | 29/852 |
| 6,924,224 | B2 * | 8/2005 | Egitto et al. | 438/622 |
| 6,936,536 | B2 * | 8/2005 | Sinha | 438/674 |
| 6,964,887 | B2 * | 11/2005 | Akagawa | 438/126 |
| 7,022,609 | B2 * | 4/2006 | Yamamoto et al. | 438/694 |
| 7,034,401 | B2 * | 4/2006 | Savastiouk et al. | 257/778 |
| 2001/0033020 | A1 * | 10/2001 | Stierman et al. | 257/737 |
| 2002/0192939 | A1 * | 12/2002 | Sugihara | 438/629 |
| 2004/0113244 | A1 * | 6/2004 | Shin et al. | 257/678 |
| 2004/0124535 | A1 * | 7/2004 | Chang | 257/758 |
| 2004/0132279 | A1 * | 7/2004 | Egitto et al. | 438/629 |
| 2004/0166661 | A1 * | 8/2004 | Lei | 438/614 |
| 2006/0145359 | A1 * | 7/2006 | Sunohara et al. | 257/778 |
| 2006/0199383 | A1 * | 9/2006 | Tachibana | 438/678 |

\* cited by examiner

*Primary Examiner*—M. Wilczewski
(74) *Attorney, Agent, or Firm*—Yingsheng Tung; Wade James Brady, III; Frederick J. Telecky, Jr.

(57) ABSTRACT

An apparatus comprising an insulating substrate (101) having first and second surfaces (101a, 101b) and a plurality of metal-filled vias (102) extending from the first to the second surface. The first and second surfaces have contact pads (103, 104), each one comprising a connector stack to at least one of the vias. The stack comprises a seed metal layer (110, copper) in contact with the via metal capable of providing an adhesive and conductive layer for electroplating on its surface, a first electroplated support layer (111a, copper) secured to the seed metal layer, a second electroplated support layer (111b, nickel), and at least one reflow metal bonding layer (112, palladium, gold) on the second support layer. The electrolytic plating process produces support layers substantially pure (at least 99.0%), free of unwanted additives such as phosphorus or boron, and exhibiting closely controlled grain sizes. Reflow metal connectors (220, 230) provide attachment to chip contact pads and external parts.

10 Claims, 5 Drawing Sheets

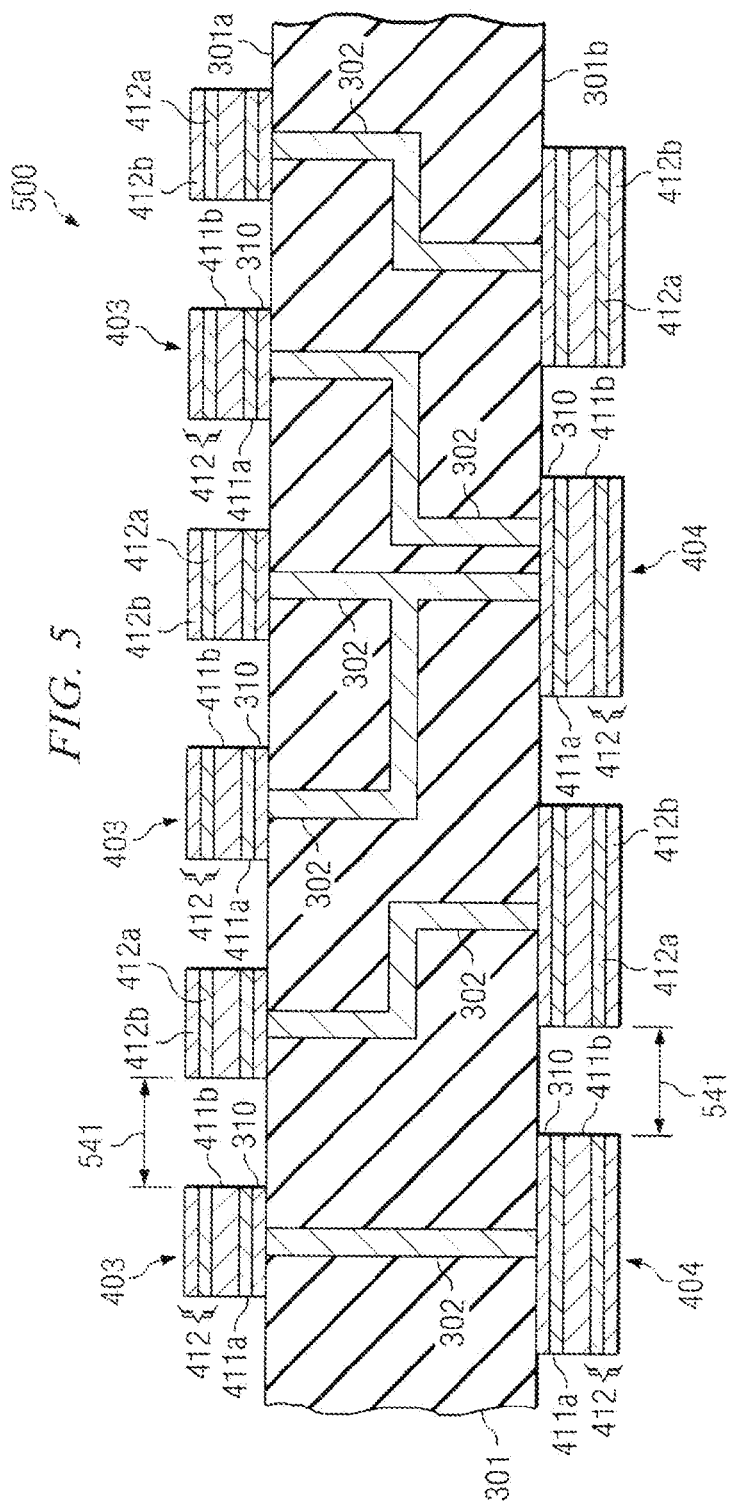

SEMICONDUCTOR ASSEMBLY HAVING SUBSTRATE WITH ELECTROPLATED CONTACT PADS

This application claims priority under 35 USC § 119 (e)(1) of provisional application No. 60/580,552 filed Jun. 17, 2004.

FIELD OF THE INVENTION

The present invention is related in general to the field of semiconductor devices and more specifically to a method for plating nickel and gold layers onto contact pads.

DESCRIPTION OF THE RELATED ART

Since the introduction of copper as interconnecting metallization in integrated circuits, copper pads in direct contact with solder have been found to exhibit weaknesses affecting the reliability of solder joints. Similarly, copper contact pads on substrates used in semiconductor assembly exhibit weaknesses affecting reliability of solder joints. The favorite solution has been the electroless plating of a nickel layer as a diffusion barrier between copper and solder to limit the solder reaction with the copper.

The electroless process, however, for depositing the nickel introduced a problem of its own, the so-called black pad caused by the galvanic corrosion of the electroless nickel plating during the immersion gold plating, often coupled with an enrichment of the nickel surface with phosphorus. Frequently, these corrosive effects are amplified by large grains of the deposited nickel, or attacks on the grain boundaries. Although a low parts-per-million defect, the black pad is held responsible for failures such as solder balls coming off, cracked solder joints, or electrically open contacts. It is particularly aggravating that black pads are difficult to find in quality inspections and usually are only found in the customer house after the device has been solder mounted.

As alternatives, a number of copper surface finishes have been proposed, which create direct contact between copper and solder. One such method is an organic surface protection film, which will evaporate at the high temperature needed for solder reflow. Other methods include a thin layer of gold, or a thin layer of tin, or a thin layer of solder, which will be dissolved into the molten solder. These alternatives produce direct contacts between copper and solder and have to deal with the copper diffusion into the solder during the elevated temperatures of solder reflow—a technical challenge in itself.

SUMMARY OF THE INVENTION

This invention fulfills the need of improving the reliability of solder-to-copper contacts, especially for the substrates employed in semiconductor assemblies. Furthermore, solder-to-copper contacts fabricated by the method of this invention are free from contamination.

One embodiment of the present invention is an apparatus comprising an insulating substrate (for example, a sheet of polyimide) having first and second surfaces and a plurality of metal-filled vias extending from the first to the second surface. The first and second surfaces have contact pads, each one comprising a connector stack to at least one of the vias. The stack comprises a seed metal layer (for example, copper) in contact with the via metal capable of providing an adhesive and conductive layer for electroplating on its surface, two electroplated support layers (for example, copper followed by nickel) secured to the seed metal layer, and at least one sacrificial metal layer (for example, palladium or gold) on the nickel support layer.

When a reflow metal connector (for example, tin or a tin alloy solder) is attached to a contact pad, the solder joint is free of contamination (for example, phosphorus) and thus reliable in life and stress testing and product application.

Another embodiment of the present invention is a semiconductor assembly consisting of a semiconductor chip solder-attached to a substrate. The chip has an active circuit and at least one metallization layer thereover, further an electrically conductive bonding surface positioned directly over the active circuit and the metallization layer. In a structure analogous to the substrate structure described above, the chip bonding surface has connector stacks to the metallization layer, wherein each stack comprises a seed metal layer (e.g., Cu) in contact with the metallization layer capable of providing an adhesive and conductive layer for electroplating on its surface. Two electroplated support layers (e.g., Cu, then Ni) are secured to the seed metal layer, and at least one sacrificial metal layer (e.g., Pd or Au) is on the Ni support layer so that each stack defines a chip bond pad.

A reflow metal connection element (e.g., Sn or Sn alloy solder) is attached to each chip bond pad. These elements connect to the contact pads on the first surface of an insulating substrate, which has first and second surfaces and a plurality of metal-filled vias extending from the first to the second surface. The substrate contact pads are in matching position to the chip bond pads. Each contact pad comprises a connector stack to at least one of the vias. Each stack comprises a seed metal layer (e.g., Cu) in contact with the via metal capable of providing an adhesive and conductive layer for electroplating on its surface. Two electroplated support layers (e.g., Cu, then Ni) are secured to the seed metal layer, and at least one sacrificial metal layer (e.g., Pd or Au) is on the Ni support layer so that each stack defines a workpiece contact pad.

The second substrate surface may have contact pads in positions operable for connections to external parts, prepared in analogous fashion to the contact pads described above.

Another embodiment of the present invention is a method for fabricating an apparatus. First, a substrate of insulating material (e.g., polyimide sheet) is provided, which has first and second surfaces and a plurality of metal-filled vias extending from the first to the second surface. A continuous layer of seed metal capable of providing an adhesive and conductive layer for electroplating on its surface (e.g., Cu) is deposited on the first and second substrate surfaces. Next, a photoresist layer is deposited on the first and second substrate surfaces, exposed, and developed so that windows are formed to selectively expose portions of the seed metal. Next, two layers of support metal (e.g., Cu, then Ni) are electrolytically plated over these exposed portions of the seed metal. At least one sacrificial metal layer (e.g., Pd or Au) is then electrolytically plated over the exposed portions of the Ni support metal. The remaining photoresist layer is removed. Finally, the exposed Cu seed metal is removed so that the plated support metal and sacrificial metal form islands which serve as contact pads.

It is a technical advantage that the invention frees the contact pad layout from the design of so-called shorting or buss bars, which serve to connect the pads for plating. Consequently, the removal of these shorting/buss bars after the plating step is not required either.

It is another technical advantage of the invention that the costly and difficult-to-control electroless nickel and immersion gold plating steps are replaced with the low cost and easy-to-control electrolytic plating step.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 5 illustrates a schematic cross section of an apparatus at another stage in the fabrication process flow.

DETAILED DESCRIPTION OF THE PREFERRED EMBODIMENTS

Figure 1:
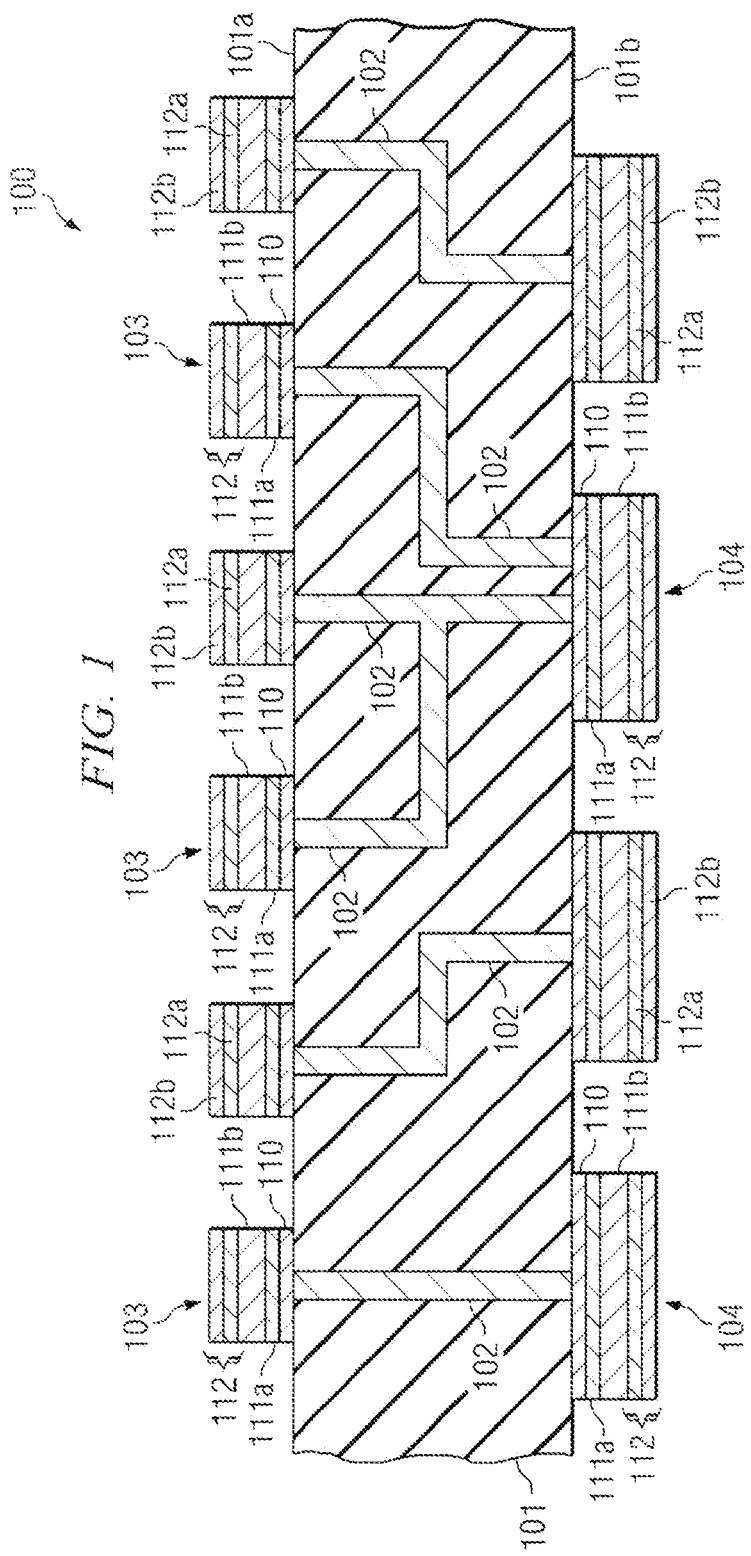
FIG. 1 is a schematic cross section of an apparatus comprising a substrate and contact pads according to an embodiment of the invention.

The schematic cross section of FIG. 1 illustrates an embodiment of the invention. In FIG. 1, a portion of an apparatus, generally designated 100, is shown comprising an insulating substrate designated 101 with a surface 101a and an opposite surface 101b. In the example illustrated in FIG. 1, the substrate has a sheet-like configuration with first and second approximately flat surfaces 101a and 101b, respectively. Examples of substrate materials include polymers such as polyimide or epoxy, or composites such as FR-4, FR-5, or glass-fiber enforced polymers, or other insulating materials. The substrate may have other geometrical configurations with two or more opposing surfaces. The substrate of the apparatus has a plurality of metal-filled vias, which extend from surface 101a to surface 101b. Typical metal for the vias is copper or a copper alloy; other options include gold.

As FIG. 1 further indicates, substrate surfaces 101a has a plurality of contact pads 103, and surface 101b has a plurality of contact pads 104. Contact pads 103 and contact pads 104 comprise a connector stack in contact with at least one of the vias 102. Each stack 103 and 104 comprises several electrically conductive layers in succession; the materials and the succession are identical for stacks 103 and stacks 104. This comes because stacks 103 on first substrate surface 101a and stacks 104 on second substrate surface 101b are fabricated in simultaneous process steps in this embodiment.

In contact with the via metal is a seed layer 110. Layer 110 is in direct contact with the via metal. A preferred metal for layer 110 is copper. This metal has the desired characteristics of promoting adhesion to the via metal and to the insulating surfaces of substrate 101. Copper is further known for its high electrical conductivity and operable to promote electroplating on its surface. Other materials that provide a suitable surface for electroplating additional copper could alternatively be used for layer 110. A typical thickness of layer 110 might be 0.2 μm.

The layer following on top of layer 110 in stacks 103 and 104 are support layers 111a and 111b, which are electroplated and thus secured to seed metal layer 110. Preferred metal for electroplated layer 111a is copper. Its thickness is preferably in the range from about 10 to 25 μm. Other metals than copper could be suitable, with the desired characteristic being the provision of a layer with excellent electrical and thermal conductivity.

Layer 111b follows directly on top of layer 111a; it is preferably nickel. Layer 111b is suitable for making connections with reflow (solder) materials and is a barrier to copper diffusion to the solder joint. The preferred thickness range for the nickel layer 111b is between about 6 and 10 μm.

The outermost layer of stacks 103 and 104 is an electroplated sacrificial layer 112 to facilitate reflow connections; specifically, the sacrificial layer 112 needs to prevent oxidation of the solderable metal 111b. Sacrificial layer 112 is thus a reflow metal bonding layer on top of support layer 111b. It may comprise palladium, or gold. Layer 112 is approximately 0.01 to 0.10 μm thick. Often it is preferred to have two sacrificial layers 112a and 112b, wherein layer 112a is preferably palladium and layer 112b preferably gold.

Since electrolytic plating processes (and not electroless plating) have been used for depositing the support layer 111a and 111b and the sacrificial metal layer 112 (or 112a and 112b), these layers are substantially pure and free of other elements; specifically, they are substantially free of phosphorus and boron. The metals for layers 111a, 111b, and 112 have a purity of at least 99.0%, preferably of at least 99.9%, and more preferably of at least 99.99%. Furthermore, the electrolytic plated support layers 111a and 111b and sacrificial metal layer 112 comprise crystal grains of controlled sizes and are thus devoid of large grain sizes. The lack of unwanted elements and large crystal sizes support the formation of controlled, defect-free, mechanically strong, and stress-tolerant solder joints.

Figure 2:
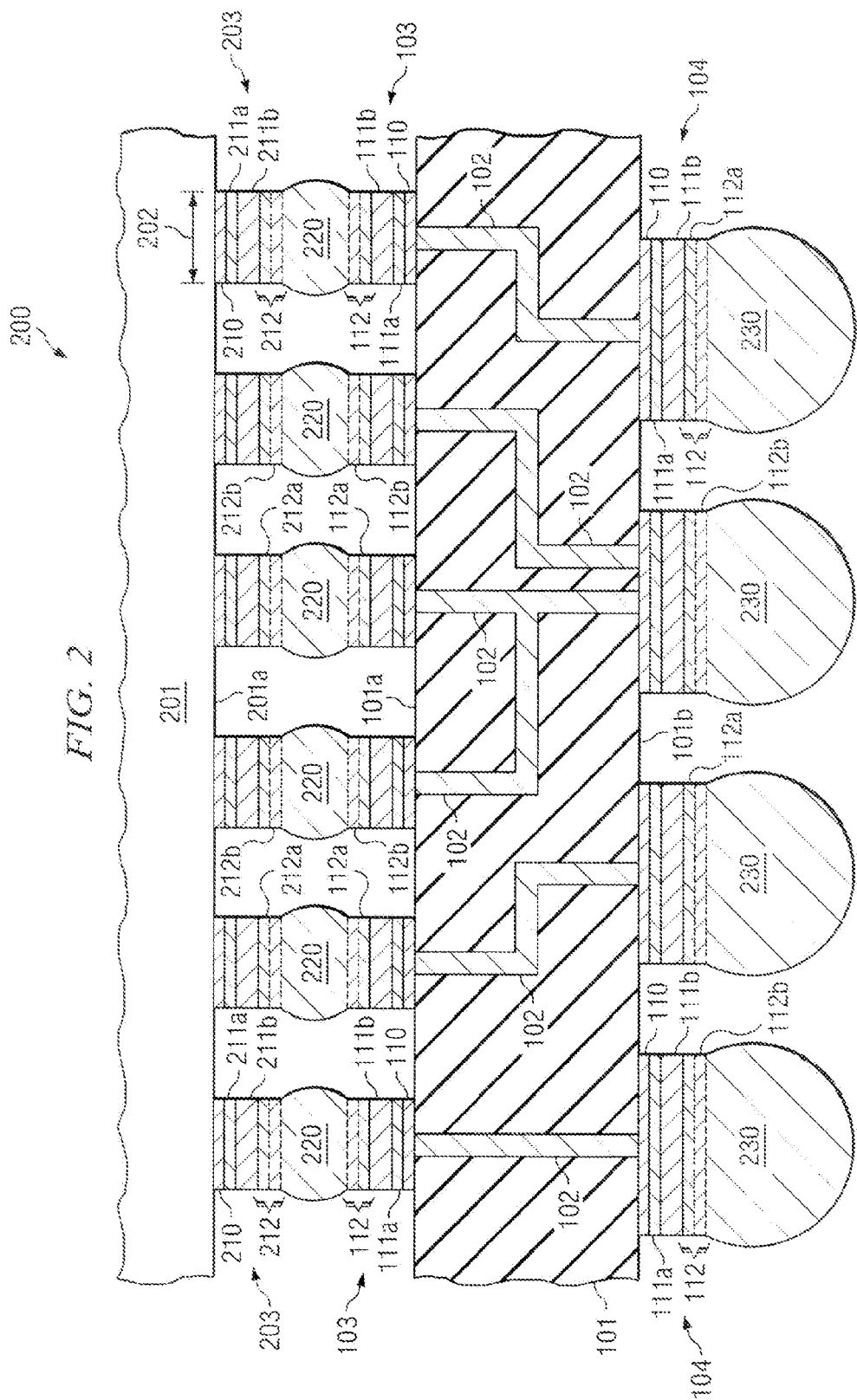
FIG. 2 is a schematic cross section of a semiconductor assembly comprising a substrate with a semiconductor chip reflow-attached to one substrate surface and reflow elements for attachment to external parts on the opposite substrate surface, according to another embodiment of the invention.

The electrolytic plating processes can be applied to surfaces of any contour, as long as they remain interconnected for the electrical bias needed during the plating step. Consequently, the plating pattern may form any desired pattern on the first and second surfaces of substrate 101, resulting frequently in a pattern on surface 101a different from the pattern on surface 101b, as illustrated in FIG. 1. In specific embodiments, workpiece 100 is intended for use in semiconductor assemblies, as shown in FIG. 2. In this case, contact pads 103 on first substrate surface 101a are arranged in number and position to match the bond pads 201 of a semiconductor chip 201. In addition, contact pads 104 on second substrate surface 101b may be frequently arranged in number and position to match the attachment pads of an external part such as a printed circuit or mother board.

In the completed semiconductor assembly illustrated in FIG. 2 and generally designated 200, reflow metal connection elements 220 are attached to contact pads 103 and interconnected to bond pads 203. Preferably, reflow metal connection elements comprise tin or tin alloys such as tin/silver, tin/indium, tin/bismuth, or tin/lead. Other alternatives include tin/silver/copper, and indium. In the reflow process, sacrificial layers 112 (or 112a and 112b) of contact pads 103 are dissolved and absorbed in the reflow alloy materials; they are thus depicted in FIG. 2 by dashed lines.

FIG. 2 illustrates the preferred case, wherein the bond pads 203 of chip 201 are also prepared by electroplating using the metal layer sequence analogous to the contact pad sequence described above for apparatus 100. Semiconductor chip 201 has an active circuit on its surface 201a and at least one metallization layer thereover (not shown in FIG. 2). Furthermore, the active circuit includes a plurality of bond pad sites 202, arranged in an electrically conductive bonding surface positioned directly over that at least one metallization layer and preferably, but not necessarily, directly over the active circuit.

It is preferred that each bond pad site 202 has a connector stack 203 connected to the at least one circuit metallization layer. Each stack 203 comprises a seed metal layer 210 in contact with the circuit metallization layer capable of providing an adhesive and conductive layer for electroplating on its surface. Layer 210 consists preferably of copper, is highly conductive and allows electroplating on its surface. Alternatively, seed metal layer 210 could be a layer which ensures that it may be successfully electroplated.

Seed metal layer 210 is topped by two support layers 211a and 211b, which are electroplated and thus secured to seed metal layer 210. Preferably, the metal of support layer 211a is copper, and of layer 211b is nickel. Other metals are suitable, especially for layer 211b, as long as they promote connection with reflow materials. The outermost layer of stack 203 is an electroplated sacrificial layer 212, preferably at least in part palladium or at least in part gold, which should prevent oxidation of the solderable metal 211b and thus facilitate reflow connection. In some products it is advantageous to have two sacrificial layers 212a, preferably palladium, and 212b, preferably gold. In FIG. 2, layers 212a and 212b are shown by dashed lines because they are already dissolved in the reflow element 220 by the reflow process.

FIG. 2 illustrates a reflow connection element 220 attached to each chip bond pad stack 203. Chip 201 and substrate 101 are thus assembled. In the embodiment of FIG. 2, the assembly is completed by attaching a reflow connection element 230 to each connection stack 104 of the contact pads on the second surface 101b of substrate 101. These connection stacks 104 comprise analogous metals to the stacks 103, as described in conjunction with FIG. 1. Again, the electroplated sacrificial metal layers 112 are shown as dashed lines, because as sacrificial layers they have been dissolved in the reflow process of the connection element 230 attachments.

Another embodiment of the invention is a method for fabricating an apparatus, comprising the following steps:

Providing a substrate 301 (see FIG. 3) of insulating material, such as polyimide, having first and second surfaces 301a and 301b, respectively. For use in semiconductor technology, the apparatus has a sheet-like substrate suitable for assembling semiconductor chips. The substrate has a plurality of vias 302, filled with metal such as copper, extending from the first to the second surface.

Depositing on the first and second substrate surfaces 301a and 301b a continuous layer 310 of seed metal capable of providing an adhesive and conductive layer for electroplating on its surface. The seed metal preferably comprises copper. The preferred method of deposition is electroless plating; an alternative method is sputtering.

Figure 3:
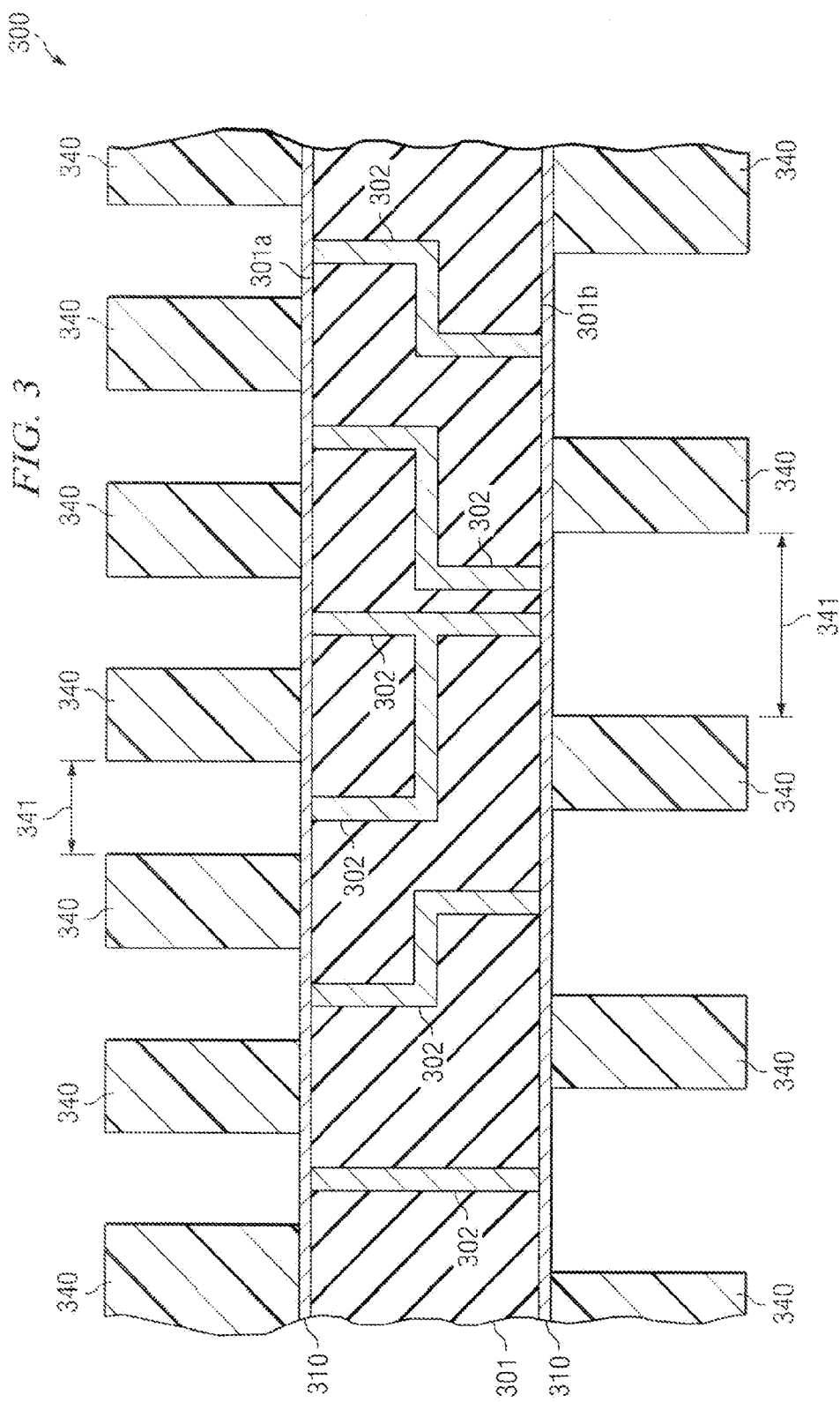
FIG. 3 illustrates a schematic cross section of an apparatus at a stage in the fabrication process flow according to another embodiment of the invention.

Depositing, exposing, and developing a photoresist layer 340 on the seed metal layer 310 on both the first and second substrate surfaces 301a and 301b, thus forming windows 341 to selectively expose portions of seed metal 310. The windows 341 may have a variety of widths on substrate surfaces 301a and 301b, as shown in FIG. 3. For apparatus, which are destined for semiconductor chip assembly, the windows on the first substrate surface may be configured to match in number and location the bond pads of a semiconductor chip to be attached to the apparatus. The windows on the second substrate surface may be configured to match the number and location of the contact pads of an external part to be attached to the apparatus. The schematic cross section of FIG. 3 is a snapshot of the status of the apparatus at this point in the fabrication process flow. It is possible that materials other than photoresist could be used for defining the plating pattern.

Figure 4:
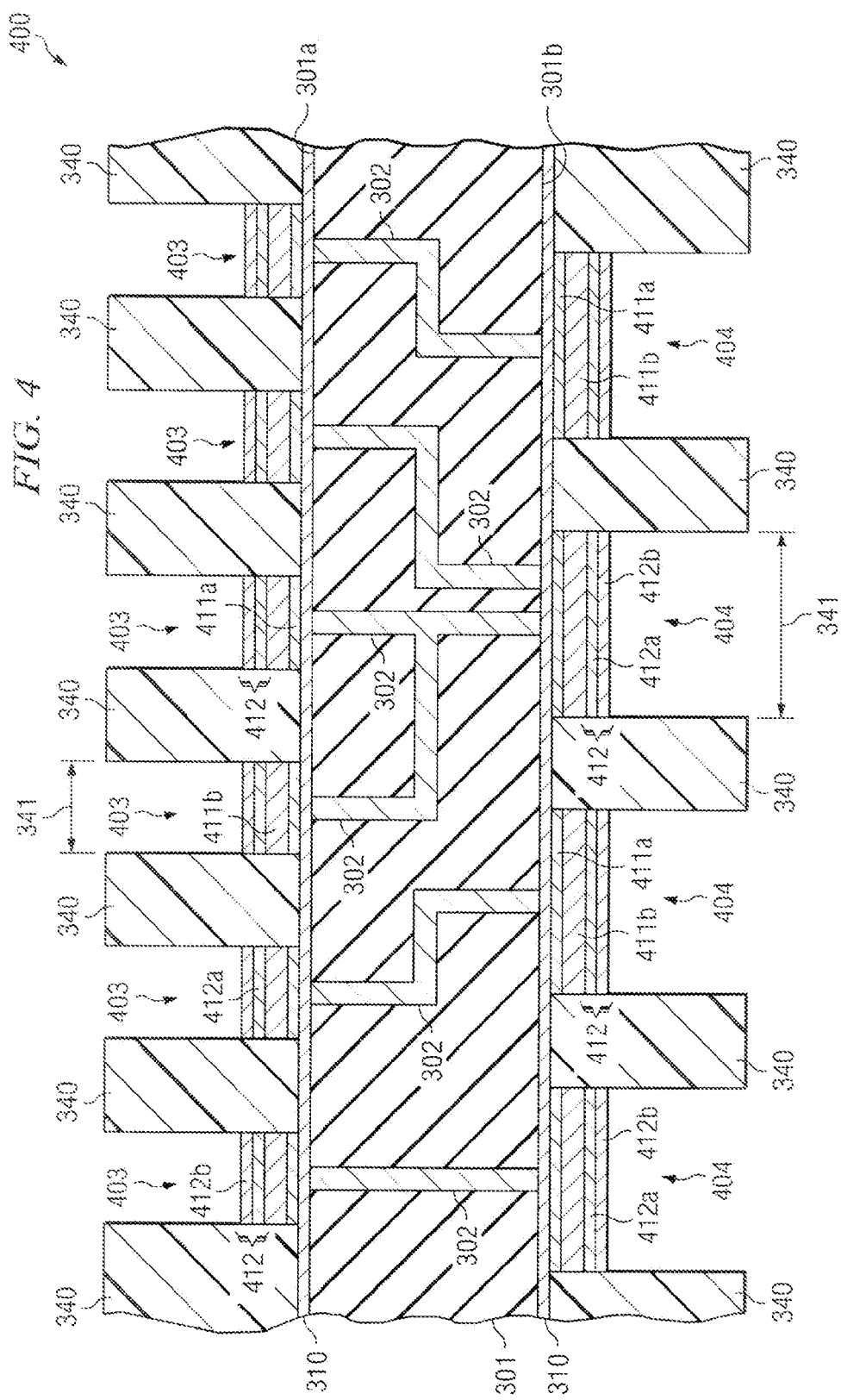
FIG. 4 illustrates a schematic cross section of an apparatus at another stage in the fabrication process flow.

Electrolytically plating a layer 411a of support metal over all exposed portions of the seed metal (see FIG. 4). A preferred choice for this support metal is copper; an alternative would be a metal or alloy with excellent electrical and thermal conductivity. The electrolytic plating process produces a support metal layer substantially pure (at least 99.0%, preferably 99.9%, more preferably 99.99%), free of unwanted additives such as phosphorus or boron, and exhibiting closely controlled grain sizes.

Electrolytically plating a layer 411b of support metal over all exposed portions of layer 411a (see FIG. 4). A preferred choice for this support metal is nickel; an alternative would be a metal or alloy with affinity for reflow metals (solders). The electrolytic plating process produces a support metal layer substantially pure (at least 99.0%, preferably 99.9%, more preferably 99.99%), free of unwanted additives such as phosphorus or boron, and exhibiting closely controlled grain sizes.

Electrolytically plating at least one sacrificial metal layer 412 over all exposed portions of support metal 411b (see FIG. 4). Layer 412 needs to prevent oxidation of the solderable metal 411b and is thus preferably comprised at least in part of palladium, or in part of gold, or may be two separate layers 412a and 412b of palladium and gold, respectively. Layer 412 is a sacrificial layer, which is being dissolved into the molten reflow connection element (solder ball) during the reflow process.

Removing the remaining photoresist layer. The schematic cross section of FIG. 5 is a snapshot of the status of the apparatus at this point in the fabrication process flow.

Removing the exposed seed metal layer, such as by etching, to electrically isolate the stacks of plated support metal and reflow bonding metal to form islands. Each island stack presents a solderable surface. The portions of exposed seed metal, which are removed in this process step, are designated 541 in FIG. 5. After the removal of the exposed seed metal, the apparatus has the appearance depicted in FIG. 1. The separated island stacks serve as contact pads of the apparatus.

An additional process step, not shown in FIG. 5, may deposit so-called solder resist (solder mask) between each contact pad in order to define more closely the contact area for the reflow metal (solder). In another additional process step, not shown in FIG. 5, a reflow metal connection element (solder ball) may be attached to each of contact stack.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the material of the semiconductor chip may comprise silicon, silicon germanium, gallium arsenide, or any other semiconductor or compound material used in IC manufacturing.

As another example, the connection elements between the substrate and the semiconductor chip can be gold bumps instead of reflow elements.

It is therefore intended that the appended claims encompass any such modifications or embodiments.

I claim:

1. A method for fabricating an apparatus comprising the steps of:
   providing a substrate of insulating material having first and second surfaces, said substrate having a plurality of metal-filled vias extending from said first to said second surface;
   depositing on said first and second substrate surfaces a continuous layer of seed metal capable of providing an adhesive and conductive layer for electroplating on its surface;
   depositing, exposing, and developing a photoresist layer on said seed metal layer on said first and second substrate surfaces, forming windows to selectively expose portions of said seed metal;
   electrolytically plating a layer of a first support metal over said exposed portions of said seed metal;
   electrolytically plating a layer of a second support metal on said exposed portions of said first support metal, said first and second support metals having a purity of at least 99.0%;
   electrolytically plating at least one sacrificial metal layer over said exposed portions of said second support metal, said sacrificial metal having a purity of at least 99.0%;
   removing the remaining photoresist layer; and removing the exposed seed metal layer, isolating said plated support metals and sacrificial metals to form islands.

2. The method according to claim 1 further comprising the step of attaching a reflow metal connection element to at least one of said islands.

3. The method according to claim 1 wherein said apparatus has a sheet-like substrate suitable for use in assembling semiconductor chips.

4. The method according to claim 1 wherein said islands are contact pads.

5. The method according to claim 1 wherein said seed metal comprises copper.

6. The method according to claim 1 wherein said first support metal comprises copper.

7. The method according to claim 1 wherein said second support metal comprises nickel.

8. The method according to claim 1 wherein said sacrificial metal is selected from a group consisting of palladium, gold, silver, and alloys thereof.

9. The method according to claim 1 wherein said islands on said first substrate surface are configured to match the number and locations of the bond pads of a semiconductor chip to be attached to said workpiece.

10. The method according to claim 1 wherein said islands on said second substrate surface are configured to match the number and locations of the contact pads of an external part to be attached to said apparatus.

* * * * *